United States Patent [19]

Nagler

[11] 4,243,460
[45] Jan. 6, 1981

[54] CONDUCTIVE LAMINATE AND METHOD OF PRODUCING THE SAME

[75] Inventor: Robert T. Nagler, Prairie du Sac, Wis.

[73] Assignee: Lundy Electronics & Systems, Inc., Glen Head, N.Y.

[21] Appl. No.: 934,049

[22] Filed: Aug. 15, 1978

[51] Int. Cl.³ .................. B32B 31/24; B32B 5/16; G21F 1/12
[52] U.S. Cl. .................. 156/275; 156/155; 156/380; 174/35 GC; 174/35 MS; 174/68 A; 250/515; 250/519; 252/500; 252/512; 260/37 M; 264/22; 428/242; 428/328; 428/332; 428/337; 428/338; 428/388; 428/560; 428/920
[58] Field of Search ............ 156/155, 275, 380; 250/515, 516, 519; 260/37 M; 252/500, 512; 428/242, 328, 332, 337, 338, 379, 388, 560, 929; 174/35 GC, 35 MS, 68 A; 264/22

[56] References Cited

U.S. PATENT DOCUMENTS

| 2,423,922 | 7/1947 | Arndt ............................ 156/275 X |
| 2,979,424 | 4/1961 | Whitehurst et al. ............. 428/388 X |
| 3,609,104 | 9/1971 | Ehrreich et al. ................ 252/511 |
| 3,649,438 | 3/1972 | Walker et al. ................... 156/275 X |
| 3,708,387 | 1/1973 | Turner et al. ................... 264/122 X |
| 3,903,328 | 9/1975 | Burdette et al. ................ 427/122 |
| 4,011,360 | 3/1977 | Walsh ............................. 428/402 |

Primary Examiner—John T. Goolkasian
Assistant Examiner—Robert A. Dawson
Attorney, Agent, or Firm—Brumbaugh, Graves, Donohue & Raymond

[57] ABSTRACT

A laminate of insulating material having fine metallic articles dispersed therein is rendered highly conductive by passing electrical energy through the laminate of sufficient strength to break down the dielectric resistance of the insulating material at the points of contact of the metallic articles.

17 Claims, 8 Drawing Figures

INDUCTION COIL

CAPACITOR DISCHARGE

CURRENT-LIMITED TRANSFORMER

CONDUCTIVE LAMINATE AND METHOD OF PRODUCING THE SAME

BACKGROUND OF THE INVENTION

Metallic or metal-coated articles, such as metallized glass fibers, are incorporated into plastic laminates to dissipate electrostatic charge and to provide shielding against electromagnetic radiation, among other benefits. These properties depend on the electrical conductivity of the metallic articles. The most common methods of making such laminates involve using metal-coated fibers which have been cut into relatively short lengths of about one-half to one inch or even shorter. The electrical properties of such laminates rely on effective metal-to-metal contact between the short lengths of metallized fiber. At high frequencies, capacitative or inductive effects between adjacent fibers may reduce the importance of metal-to-metal contact.

In making the laminates, the short lengths of metal-coated fiber are combined in with fluid polymerizable material which becomes the plastic matrix. In the fabrication of the laminate, the many individual lengths of metallized fiber develop a thin film of the insulating plastic, perhaps as thin as a few hundred-thousandths of an inch, at the point of contact with adjacent metal-coated fibers. This thin insulating film reduces or destroys the electrical conductivity at the fiber junction points. Since the metal-coated fibers in the finished laminate take the form of a three-dimensional network, there is a myriad of potential parallel paths for the flow of electric current. The conductivity of the laminate is the combined effect of the conductivity of the many individual current paths.

SUMMARY OF THE INVENTION

The invention relates to a method and resultant product of improving the electrical conductivity of laminates of insulating material having fine metallic articles dispersed therein. I have discovered that by causing an electric current to pass through such a laminate under proper conditions the conductivity of the laminate will be significantly and permanently improved. These proper conditions require that the extremities of the laminate be connected briefly to a source of electrical energy which is of sufficiently high potential to break down the dielectric resistance of the insulating material in the junction points between the metallic articles, but which is not so high as to cause physical degradation of the laminate. The required potential and the maximum permissible energy dissipation depend on the nature of the laminate being treated. Energy dissipation in the laminate should not reach excessive levels at which the metallic articles or the insulating material would burn.

The required conditions for applying electrical energy to the laminate may be obtained by various means, including but not necessarily limited to those described further herein. In a preferred method the secondary current of a high-voltage induction coil is passed through the laminate. Both the potential and energy dissipation are controlled by the parameters of the induction coil; typically the secondary delivers a very high potential but very little energy.

Another means of practicing the invention involves passing the secondary current of a low-frequency transformer through the laminate. The applied potential is determined by the turns ratio of the transformer and the voltage supplied to the primary. The energy dissipated may be controlled by any one of a number of well-known means, such as current-limiting devices or circuits in the primary or secondary of the transformer or a high reactance transformer design. In a further variation, an electrical capacitor is discharged through the laminate. The applied potential is determined by the voltage to which the capacitor is charged, and the energy dissipated during the discharge is determined by the energy storage capacity of the capacitor.

Practice of the invention, as described above or through similar means, results in a significant and permanent improvement in the electrical conductivity of the laminate. In a preferred laminate of plastic or resin material incorporating metal-coated fibers, it is believed that impressing a voltage in excess of the dielectric strength of the plastic, typically within the range of 100 to 500 volts per mil (0.001 inch), punctures or breaks down the plastic, the extent of which depends on the amount of current applied. Since the thickness of the plastic film separating contact points of the individual metal-coated fibers is generally much less than one mil, a relatively small potential is sufficient to cause dielectric breakdown. In theory, once these thin insulating layers between adjacent fibers have been broken down, there are many more parallel current paths set up and the conductivity of the laminate is greatly improved.

The essential features and further advantages of the invention are set forth in detail below in conjunction with the following drawings.

DESCRIPTION OF THE PREFERRED EMBODIMENT

The invention is applicable to laminates of insulating material having fine metallic articles dispersed contiguously therein. The preferred laminate is made of plastic or resin material and incorporates metal-coated glass fibers or comparable materials. Such laminates may be fabricated under any suitable process including: hand lay-up, machine lay-up, spray-up, low pressure molding, matched die molding, injection molding, filament winding, and pultrusion. Besides metal-coated glass fibers, metallic articles such as fine strips of aluminum foil, wire, or flakes may also be used.

The preferred laminates are made with commercial polyester resins and incorporate various weight percentages of metal-coated glass fibers cut to various lengths. The metallized fibers may be cut from fiber bundles or strands. Good results have been obtained for metallized fiber contents ranging from 5% to 30% by weight in cut lengths ranging from one-quarter inch to one inch. Comparable or better results could be obtained with higher percentage loadings of metallized fiber or longer cut lengths. The method of fabricating the laminate and the uniformity of distribution of the metallized fiber would also be significant variables.

In practicing the invention with plastic laminates, it is necessary to make electrical connections to at least two points on the laminate. These points should be as widely separated as the geometry of the laminate allows, so that the current flows through the greatest possible volume. The surfaces of a plastic laminate are usually resin-rich, i.e. the dispersed metal-coated fibers are not exposed at the surfaces or edges but are usually covered by an insulating layer of resin. (Since the resin in fluid prior to curing, it tends to flow around and enclose the fibers.) Because of this resin-rich condition, measures must be taken to ensure a good electrical connection between the metal-coated fibers and the contacts applied to the surfaces of the laminate.

Figure 1A:
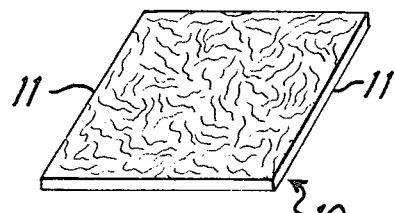
FIGS. 1A–E show several alternative contact points for applying electrical energy to the laminate as called for in the invention.
Figure 1B:
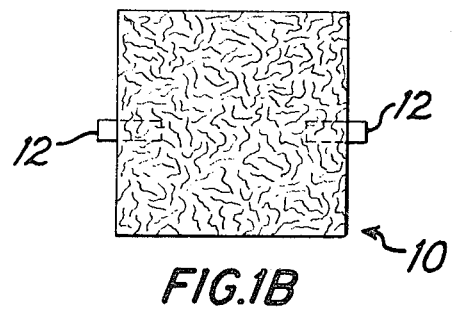
Figure 1C:
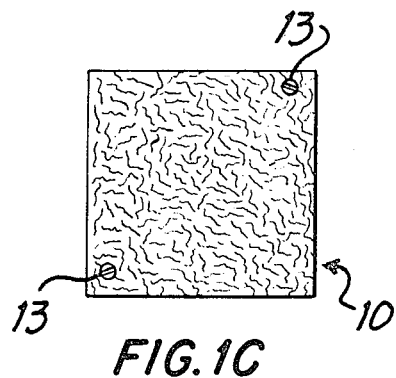

The drawings illustrate some of the measures which may be used to make effective electrical connections to the metallized fibers within the laminate. In FIG. 1A opposite edges 11 of the laminate 10 are sanded to remove the surface layer of resin and expose the metallized fibers. These edges are then coated with a conductive paint, which usually consists of finely divided silver or copper in a suitable vehicle. After the paint dries, electrical connection may be made to the painted edges. In FIG. 1B small tabs 12 of thin aluminum foil are imbedded in the plastic matrix during fabrication of the laminate 10 so that they are in direct contact with the metal-coated fibers. One end of each foil tab extends beyond the resin-rich surface, and electrical connection can be made to it by means of clips, clamps, or screws. In FIG. 1C self-tapping screws 13 are driven in undersized holes drilled into the laminate 10 through the metallized fiber material. The helical screw threads cut through the matrix material and make contact with the metal coating on the fibers. Wires or terminal lugs can be attached under the screw heads.

Figure 1D:
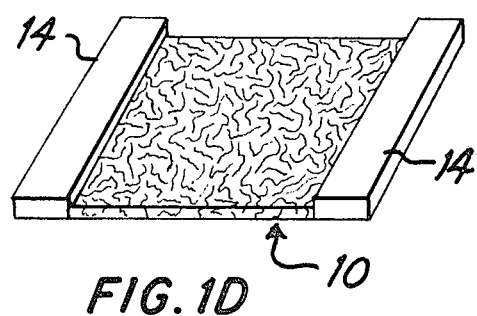
Figure 1E:
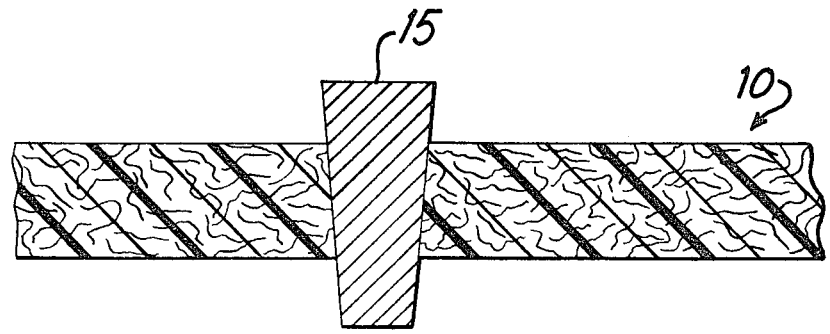

The edges of the laminate shown in FIG. 1D are sanded to expose the metallized fibers, and electrical connection is made by metal strips or bars 14 pressed or clamped against the sanded edges. When the high-voltage high-frequency induction coil is used, a simplified version of FIG. 1D may conveniently be employed. Without sanding the edges, a grounded metal bar is laid against one edge of the laminate and the high voltage terminal of the induction coil is brought close to the opposite edge and moved slowly along the entire edge. The high voltage spark penetrates the insulating layer of plastic to reach the metallized fibers beneath. In FIG. 1E holes are drilled in the laminate and taper-reamed, for example, to a standard taper of 0.25 inch per foot. Metal pins 15 of the same taper are driven into the holes. The metallized fiber is exposed in the wall of the hole, and the taper gives a wedging action which provides good contact. Electrical connections are made to the taper pins. There are of course many other methods that may be used to ensure that contact be made to the metal coating on the fibers and not merely to the insulating surface of the laminate.

The specific parameters of applying electrical energy to the laminate vary widely depending on the dimensions and characteristics of the laminate being treated. According to the invention, the applied voltage must be high enough to cause dielectric breakdown of the thin insulating films of plastic between conductive fibers and to cause a flow of current through the laminate. The existence of this condition can readily be determined by use of electrical measuring instruments such as an ammeter or voltmeter or, in the case of the induction coil, by observing the passage of sparks from the high voltage terminal to the laminate. The power dissipated should be the minimum necessary to develop good electrical conductivity in the laminate.

Figure 2:
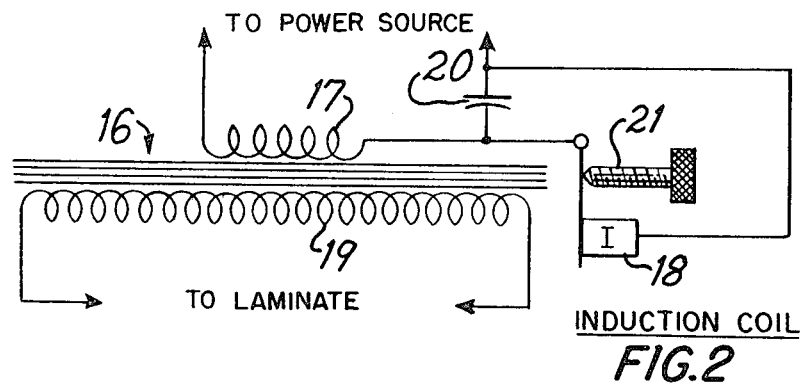
FIGS. 2–4 show, respectively, a typical induction coil, capacitor discharge, and current-limited transformer for practicing the invention.

FIG. 2 shows a circuit of a typical induction coil for use in the invention. The power source may be either alternating or direct current at a voltage depending on the design of the transformer 16. The primary winding 17 of the transformer consists of a relatively small number of turns wound on a soft iron core. An interrupter 18 is located so that the magnetic field developed in the core by a flow of current in the primary pulls the armature away from a stationary contact. This causes the primary circuit to open and the magnetic field to collapse, thus allowing the armature to touch the stationary contact whereupon the sequence is repeated. The collapse of the magnetic field induces a current in the secondary winding 19, which consists of very many turns of fine wire. The frequency of this current is determined by the inductance of the primary winding and the capacitance of the capacitor 20, and the voltage is determined by the turns ratio. A device 21 for adjusting the spring tension on the interrupter armature is usually provided so that the time rate of change of the magnetic field can be maximized. In a typical induction coil used in the invention, the power source is 120 volts at 60 Hertz, the output voltage 25,000 to 30,000 volts, the power output 5 watts, and the frequency 500 kiloHertz.

Figure 3:
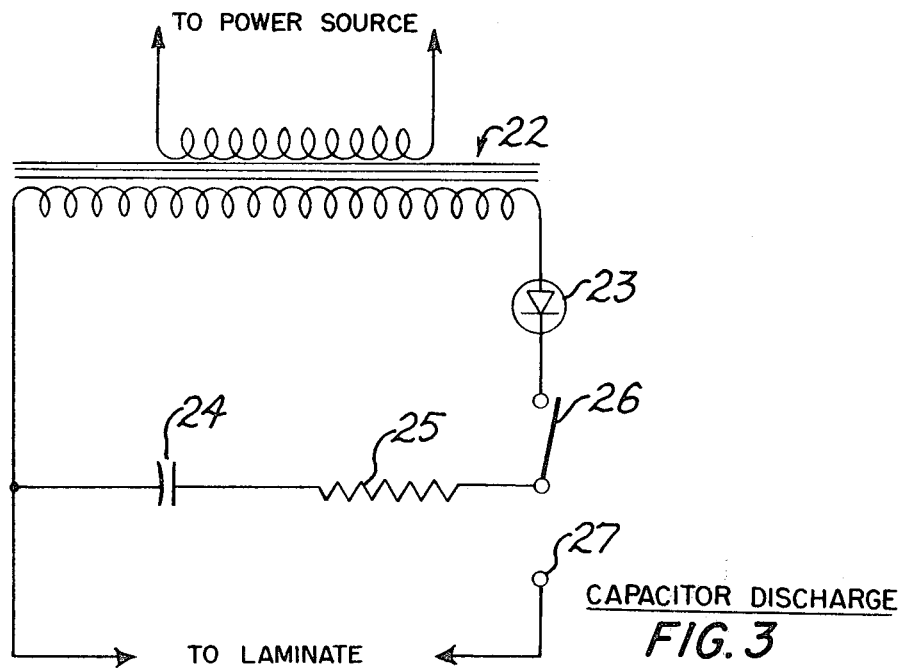

FIG. 3 shows a typical capacitor discharge circuit used in the invention. A transformer 22 and rectifier 23 constitute a source of rectified direct current at a peak voltage suitable for the working voltage rating of a capacitor 24. A resistor 25 is connected in series with the capacitor to limit the peak current flow during the charging or discharging. When the switch 26 is connected to the rectifier 23, capacitor 24 becomes charged to the peak voltage of the power supply. When switch 26 is connected to the output circuit 27, capacitor 24 discharges through the laminate. Typical values for the components for the capacitor discharge circuit are: a transformer secondary voltage of 300 volts RMS, 423 volts peak; a silicon diode rectifier rated at 20 amperes and 1000 peak inverse voltage; an electrolytic capacitor of 100 microfarads, 450 VDC working voltage; a 100 ohm resistor rated at 2 watts; and an energy storage capacity of the circuit of approximately 18 watt-seconds.

Figure 4:
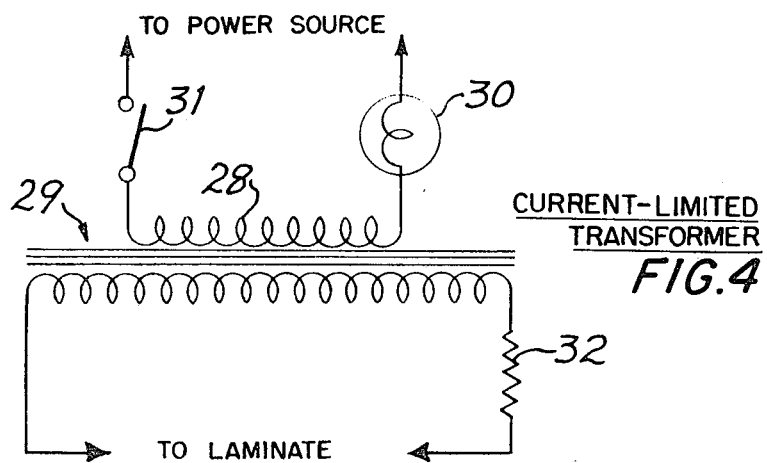

FIG. 4 illustrates a typical current-limited transformer circuit for use in the invention. The primary winding 28 of the transformer 29 is connected in series with an incandescent lamp bulb 30, which acts as a current limiting device. When switch 31 is closed a high voltage is developed across the secondary of the transformer which breaks down the insulating plastic between the metallized fibers in the laminate and causes a current to flow through the laminate. This causes the current in the primary to increase, which in turn increases the current through lamp 30 and causes the tungsten filament to heat. Because tungsten has a high temperature coefficient of resistivity, the resistance of the lamp 30 increases sufficiently to limit the primary current to a safe value. Series resistor 32 limits the current through the laminate during the short time required for the lamp filament to heat. Typical values for the components of the circuit are: a transformer of 120 volts, 60 Hz primary, 480 volts RMS secondary; a 60 watt, 120 volt tungsten lamp bulb; a 100 ohm resistor rated at 2 watts; and a maximum current through the laminate of approximately 100 milliamperes.

The above-described circuits for practicing the invention were tested on laminate samples made by hand-lay-up in the form of sheets either 6 inches square and 0.25 inches thick or 9 inches square and 0.125 inches thick. The resistance of the laminate samples before and after treatment according to this invention was measured with an ohmmeter having a sensitivity of 20,000 ohms per volt. The measurements were also confirmed by readings obtained by using an electronic ohmmeter and by measuring the voltage drop across the specimen during passage of a known alternating current.

EXAMPLE I 43 grams of a 30-filament strand of metallized glass fiber chopped to ½ inch lengths were spread evenly in an aluminum mold 9 inches square and 0.125 inch thick (inside dimensions). 170 grams of W. R. Grace Co. Hatco 12184 polyester resin mixed with 1% by weight of Luperco ATC catalyst (containing 50% benzoyl peoxide in tricresyl phosphate) was poured into the mold and distributed evenly over and through the fiber material. The mold was placed between two sheets of Mylar film and cured in a laboratory hydraulic press with platens heated to 110° C. for 10 minutes under a load of 6 tons. After cooling and removal of overflowed resin the finished laminate weighed 205 grams with a resulting fiber content of 21%.

Three strips one inch wide and nine inches long were cut from this laminate. Electrical connections to the laminate were made as shown in FIG. 1C, by drilling 0.106 inch holes ½ inch from each end and driving #6×⅜ inch pan head tapping screws into the holes. The resistance between the two tapping screws on the first strip was measured with a volt-ohmmeter and found to be 35,000 ohms. One screw was then connected to a ground wire, and the high voltage terminal of an induction coil as shown in FIG. 2 was placed in contact with the other screw for a period of 30 seconds. After this treatment the resistance was measured at 42 ohms. The resistance of the second strip was measured to be 26,000 ohms. A capacitor discharge apparatus as shown in FIG. 3 was discharged once through the laminate. After this treatment the resistance was measured at 43 ohms. The resistance of the third strip was measured to be 39,000 ohms. Power was applied to the laminate from a current-limited transformer as shown in FIG. 4 for 30 seconds. After this treatment the resistance was found to be 10 ohms.

EXAMPLE II 36 grams of a 720-filament yarn of metallized glass fiber chopped to ½ inch lengths were mixed with 150 grams of catalyzed Hatco 12184 polyester resin as described in Example I. The mixture was poured into an aluminum mold 6 inches square and 0.25 inch thick (inside dimensions) and rolled to obtain uniform distribution free from air bubbles. The laminate was cured by hot pressing under the conditions described in Example I. The finished laminate weighed 178 grams, giving a fiber content of 20%. Electrical connections were formed in the laminate using tapping screws as in Example I.

The resistance between the two screws was measured with a volt-ohmmeter and found to be 1 megohm (1,000,000 ohms). The screws were then connected to the induction coil, as in Example I, for a period of 15 seconds. After this treatment the resistance between the screws was found to be 900 ohms.

EXAMPLE III 17 grams of a 660-filament metallized glass fiber roving chopped to ½ inch lengths were spread evenly in an aluminum mold 6 inches square and 0.25 inch thick (inside dimensions). 150 grams of W. R. Grace Co. Hatco GR-394 polyester resin mixed with 1% by weight of Lupersol DDM catalyst (containing 60% methyl ethyl ketone peroxide in dimethyl phthalate) was poured into the mold and distributed evenly over and through the fiber material. The laminate cured overnight at room temperature. The weight of the finished laminate was 163 grams, giving a fiber content of 10%.

Two opposite edges of the laminate were sanded to expose the metallized fiber and painted with a coat of silver conductive paint, as shown in FIG. 1A. The resistance between the painted edges were measured to be in excess of 50 megohms. A capacitor discharge apparatus as shown in FIG. 3 was discharged once through the laminate. After this treatment the resistance between the silvered edges was found to be 600 ohms, equivalent to a volume resistivity of the laminate of 381 ohm-centimeters.

EXAMPLE IV

A laminate sample containing 25% by weight of metal-coated fibers 1 inch long showed a resistance of 1,100 ohms. A potential of 12 volts at 60 Hz. was applied with a current-limited transformer as shown in FIG. 4. After this treatment, the resistance dropped to 600 ohms. Another sample containing 20% by weight of metal-coated fibers 1 inch long showed a resistance of 115 ohms; after treatment with the induction coil, the resistance was 36 ohms.

A further sample containing 25% by weight of metal-coated fibers 1 inch long showed a resistance of 1050 ohms. After treatment with the capacitor discharge circuit, the resistance was 17 ohms. The laminate was then connected to a source of 60 Hz. alternating current and a potential of 33 volts was applied, causing a steady current of 400 to 500 milliamperes to flow. The resistance of the laminate increased to 66 ohms after treatment of a few seconds under these conditions. This test demonstrated the adverse effect of excessive energy dissipation in the laminate.

In the above tests, treatment of the laminate by the induction coil proved to be the preferred method. The high voltage generated by the induction coil is adequate for almost any type of plastic laminate. The visible sparks are direct evidence that the current is passing through the material, and the electrical connection for purposes of treatment is considerably simplified. The energy delivered is low enough to avoid damage to the flexural strength and desired properties of the laminate.

The invention has application to laminates of other types of plastic or other insulating materials or having other forms of metallic bodies incorporated therein. Electrical treatment of the laminate can be accomplished by methods analagous to those described above in order to achieve the desired improvement in the conductivity of the laminate. It will be understood that the above described methods and resultant products are merely exemplary and that those skilled in the art may make many variations and modifications without departing from the spirit and scope of the invention. All such modifications and variations are intended to be within the scope of the invention as defined in the appended claims.

I claim:

1. A method of improving the conductivity of a laminate of resinous insulating material having dispersed therein metallic articles selected from the group consisting of metal-coated glass fibers, strips of aluminum foil, wire and flakes comprising the step of passing electrical energy through the laminate of sufficient strength to break down the dielectric resistance of the insulating material at points of contact of the metallic articles.

2. A method of improving the conductivity of a laminate of resinous insulating material having dispersed therein metallic articles selected from the group consisting of metal-coated glass fibers, strips of aluminum foil, wire and flakes comprising the step of passing electrical energy through the laminate of sufficient strength to permanently enhance the electrical connection at points of contact of the metallic articles.

3. The method of claims 1 or 2 wherein the insulating material is a resin material.

4. The method of claims 1 or 2 wherein the metallic articles are metal-coated glass fibers.

5. The method of claim 4 wherein the metal-coated glass fibers are about one to one-half inch in length or shorter.

6. The method of claims 1 or 2 wherein the electrical energy is applied from a high-voltage induction coil through the laminate.

7. The method of claims 1 or 2 wherein the electrical energy is applied from a high-voltage transformer through the laminate.

8. The method of claims 1 or 2 wherein the electrical energy is applied from a high-voltage discharge capacitor through the laminate.

9. The method of claim 6 wherein the step of passing electrical energy includes placing one terminal of the induction coil adjacent an end of the laminate and moving the other terminal along an opposite end of the laminate.

10. An improved conductive laminate of resinous insulating material having dispersed therein metallic articles selected from the group consisting of metal-coated glass fibers, strips of aluminum foil, wire and flakes, said laminate being treated by the method of passing electrical energy through the laminate of sufficient strength to break down the dielectric resistance of the insulating material at points of contact of the metallic articles.

11. An improved conductive laminate of resinous insulating material having dispersed therein metallic articles selected from the group consisting of metal-coated glass fibers, strips of aluminum foil, wire and flakes, said laminate being treated by the method of passing electrical energy through the laminate of sufficient strength to permanently enhance the electrical connection at points of contact of the metallic articles.

12. The laminate of claims 10 or 11 wherein the insulating material is a resin material.

13. The laminate of claims 10 or 11 wherein the metallic articles are metal-coated glass fibers.

14. The laminate of claim 13 wherein the metal-coated glass fibers are about one to one-half inch in length or shorter.

15. The method of claim 6 also including the steps of establishing electrical contacts with the metallic articles at at least two points on the laminate, and connecting the terminals of the induction coil to the contacts.

16. The method of claim 7 also including the steps of establishing electrical contacts with the metallic articles at at least two points on the laminate, and connecting the terminals of the secondary winding of the transformer to the contacts.

17. The method of claim 8 also including the steps of establishing electrical contacts with the metallic articles at at least two points on the laminate, and connecting the capacitor to the contacts.

* * * * *